United States Patent
Eberspaecher et al.

(10) Patent No.: US 11,940,618 B2
(45) Date of Patent: Mar. 26, 2024

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Alexander Eberspaecher, Aalen (DE); Frank Schatz, Kornwestheim (DE); Janine Riedrich-Moeller, Leonberg-Warmbronn (DE); Joerg Muchow, Munich (DE); Josip Mihaljevic, Holzgerlingen (DE); Kerrin Doessel, Stuttgart (DE); Ralf Boessendoerfer, Dinkelsbuehl (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 684 days.

(21) Appl. No.: 17/255,233

(22) PCT Filed: Aug. 20, 2019

(86) PCT No.: PCT/EP2019/072217
§ 371 (c)(1),
(2) Date: Dec. 22, 2020

(87) PCT Pub. No.: WO2020/052919
PCT Pub. Date: Mar. 19, 2020

(65) Prior Publication Data
US 2021/0271073 A1    Sep. 2, 2021

(30) Foreign Application Priority Data
Sep. 12, 2018 (DE) .......................... 102018215528.3

(51) Int. Cl.
*G02B 26/08* (2006.01)
*B81B 3/00* (2006.01)
(Continued)

(52) U.S. Cl.
CPC ........ *G02B 26/0858* (2013.01); *B81B 3/0021* (2013.01); *B81B 7/02* (2013.01);
(Continued)

(58) Field of Classification Search
CPC ...... B81B 2201/042; B81B 2201/0161; B81B 3/0021; B81B 1/00134; B81B 7/02; G02B 26/0858
See application file for complete search history.

(56) References Cited

U.S. PATENT DOCUMENTS

2006/0082250 A1    4/2006  Ko et al.
2011/0032590 A1    2/2011  Terada et al.
(Continued)

FOREIGN PATENT DOCUMENTS

CN     102739104 A       10/2012
DE     102008012825 A1   10/2008
(Continued)

OTHER PUBLICATIONS

International Search Report for PCT/EP2019/072217, dated Nov. 19, 2019.

*Primary Examiner* — J. San Martin
(74) *Attorney, Agent, or Firm* — NORTON ROSE FULBRIGHT US LLP; Gerard A. Messina (57) ABSTRACT

A micromechanical component. The micromechanical component includes: a mount; a displaceable part; and a first serpentine spring and a second serpentine spring which is embodied mirror-symmetrically with respect to the first serpentine spring in terms of a first plane of symmetry; a first actuator device and a second actuator device being embodied in such a way that by way of the first actuator device and the second actuator device, periodic deformations, mirror-symmetrical in terms of the first plane of symmetry, of the first serpentine spring and of the second serpentine spring
(Continued)

are excitable; the micromechanical component also encompassing a first torsion spring and a second torsion spring that each extend along a rotation axis; and the displaceable part being displaceable, at least by way of the periodic and mirror-symmetrical deformations of the first serpentine spring and of the second serpentine spring, around the rotation axis with respect to the mount.

13 Claims, 6 Drawing Sheets

(51) Int. Cl.
    *B81B 7/02*     (2006.01)
    *B81C 1/00*     (2006.01)

(52) U.S. Cl.
    CPC .... *B81C 1/00134* (2013.01); *B81B 2201/042* (2013.01); *B81C 2201/0161* (2013.01)

(56) References Cited

U.S. PATENT DOCUMENTS

| | | | | |
|---|---|---|---|---|
| 2011/0122471 | A1* | 5/2011 | Terada | H10N 30/2044 359/199.1 |
| 2011/0292479 | A1* | 12/2011 | Hiraoka | G02B 26/0858 359/199.1 |
| 2012/0160557 | A1* | 6/2012 | Yamada | G02B 26/0858 174/544 |
| 2012/0320439 | A1* | 12/2012 | Hiraoka | G02B 26/0858 359/214.1 |
| 2012/0327495 | A1* | 12/2012 | Aimono | G02B 26/0858 359/224.1 |
| 2013/0063800 | A1 | 3/2013 | Naono | |
| 2013/0301103 | A1 | 11/2013 | Aimono | |
| 2014/0268271 | A1 | 9/2014 | Tani | |
| 2014/0355088 | A1 | 12/2014 | Yasuda et al. | |
| 2015/0077823 | A1* | 3/2015 | Hashiguchi | H04N 9/3135 359/200.8 |
| 2015/0198801 | A1* | 7/2015 | Naono | G01L 1/16 359/199.4 |
| 2017/0160540 | A1 | 6/2017 | Giusti et al. | |
| 2018/0172982 | A1 | 6/2018 | Okada et al. | |

FOREIGN PATENT DOCUMENTS

| | | |
|---|---|---|
| DE | 102012005805 A1 | 9/2012 |
| EP | 2574974 A1 | 4/2013 |
| EP | 2781948 A1 | 9/2014 |
| JP | 2009223165 A | 10/2009 |

\* cited by examiner

MICROMECHANICAL COMPONENT AND METHOD FOR PRODUCING A MICROMECHANICAL COMPONENT

FIELD

The present invention relates to a micromechanical component. The invention also relates to a manufacturing method for a micromechanical component.

BACKGROUND INFORMATION

Japan Patent Application JP 2009-223165 A describes a displaceable micromirror that is said to be displaceable, by way of two serpentine springs having sub-portions that are each covered with at least one piezoelectric material, with respect to a mount of the displaceable micromirror. In particular, by application of at least one voltage to the at least one piezoelectric material, a flexural or tensile stress on the sub-portions of the two serpentine springs is said to be alternatingly configurable in such a way that the displaceable micromirror becomes displaced with respect to its mount by way of an effected mirror-symmetrical deformation of the two serpentine springs.

SUMMARY

The present invention provides a micromechanical component, and a manufacturing method for a micromechanical component.

In accordance with an example embodiment of the present invention, micromechanical components are provided, each having a displaceable part that is displaceable in controlled fashion around the rotation axis defined by the configuration of the two torsion springs, an occurrence of further undesired displacement motions of the displaceable part, i.e., an occurrence of so-called spurious modes, being reduced or prevented by way of the two torsion springs. Upon operation of a micromechanical component of this kind, a frequency of occurrence of excitation of spurious modes is therefore significantly reduced as compared with the related art.

As will be explained below in further detail, the two torsion springs in particular counteract a "lifting" of the displaceable part out of a plane of the two torsion springs, or counteract a spurious mode of the displaceable part perpendicularly to the rotation axis. The present invention thus provides micromechanical components with improved operation as compared with the related art. The present invention additionally ensures this advantage for the micromechanical components with comparatively low costs for manufacturing the micromechanical components.

In an advantageous embodiment of the present invention, the micromechanical component encompasses at least one sensor device that is designed to output or furnish at least one sensor signal corresponding to an excursion of the displaceable part out of its idle position with respect to the mount, the sensor device being connected, via at least one signal lead embodied on and/or in the first torsion spring and/or the second torsion spring, to an evaluating electronic system embodied on the mount or to an evaluating electronic system application contact embodied on the mount. For electrical contacting of the sensor device, a signal lead in accordance with the related art, embodied on and/or in the at least two serpentine springs, can therefore be omitted. Electrical contacting of the sensor device is thus not associated with any secondary effects on a desired good flexural capability of the at least two serpentine springs.

The first actuator device and the second actuator device preferably each encompass several piezoelectric actuator layers made of at least one piezoelectric material, which are embodied on and/or in several sub-portions of the associated serpentine spring and each encompass at least one electrical lead that is embodied on and/or in the associated serpentine spring, so that at least one voltage signal can be applied to the piezoelectric actuator layers of the first serpentine spring and of the second serpentine spring in such a way that the periodic and mirror-symmetrical deformations of the first serpentine spring and of the second serpentine spring are producible. Those sub-portions of the first serpentine spring and of the second serpentine spring which are embodied with piezoelectric actuator layers can thus be deflected in such a way that the displaceable part becomes displaced around the rotation axis out of its idle position through a relatively large displacement angle with respect to the mount.

In an advantageous embodiment of the micromechanical component in accordance with the present invention, each two adjacent sub-portions, embodied with piezoelectric actuator layers, of the first serpentine spring are connected to one another via a respective intermediate portion of the first serpentine spring, and each two adjacent sub-portions, embodied with piezoelectric actuator layers, of the second serpentine spring are connected to one another via a respective intermediate portion of the second serpentine spring, at least one of the intermediate portions of the first serpentine spring being connected via a respective strut element to that intermediate portion of the second serpentine spring which is mirror-symmetrical in terms of the first plane of symmetry. In this case the at least one strut element of the micromechanical component contributes to additional suppression of spurious modes.

Alternatively or additionally, the sub-portions of the first serpentine spring which are embodied with piezoelectric actuator layers, and the sub-portions of the second serpentine spring which are embodied with piezoelectric actuator layers, are aligned parallel to one another and perpendicularly to the rotation axis. In this case a concave and convex deformation of the sub-portions in such a way that at least one convexly deformed sub-portion is located adjacently to a concavely deformed sub-portion, and at least one concavely deformed sub-portion is located adjacently to a convexly deformed sub-portion, brings about a rotation of the displaceable part around the rotation axis.

As an advantageous refinement of the present invention, at least two adjacent sub-portions of the first serpentine spring which are embodied with piezoelectric actuator layers, and at least two adjacent sub-portions of the second serpentine spring which are embodied with piezoelectric actuator layers, are connected to one another via a respective intermediate spring element. In this case the at least two intermediate spring elements also contribute to the suppression of spurious modes upon operation of the micromechanical component.

As a further advantageous refinement of the present invention, the micromechanical component can additionally also encompass a third serpentine spring and a fourth serpentine spring which is embodied mirror-symmetrically with respect to the third serpentine spring in terms of the first plane of symmetry, which are each attached at an outer end of the respective serpentine spring directly or indirectly to the mount, and each attached at an inner end of the respective serpentine spring directly or indirectly to the displaceable part. Preferably a third actuator device is embodied on and/or in the third serpentine spring, and a fourth actuator device is embodied on and/or in the fourth serpentine spring, in such a way that by way of the third actuator device and the fourth actuator device, periodic deformations of the third serpentine spring and of the fourth serpentine spring which are mirror-symmetrical in terms of the first plane of symmetry are excitable by way of the third actuator device and the fourth actuator device, which deformations are opposite in phase to the periodic and mirror-symmetrical deformations of the first serpentine spring and of the second serpentine spring. Comparatively large displacement forces can easily be exerted on the displaceable part by way of the four serpentine springs present in the context of this embodiment of the micromechanical component.

Preferably the third serpentine spring and the fourth serpentine spring are mirror-symmetrical with respect to the first serpentine spring and the second serpentine spring in terms of a second plane of symmetry aligned perpendicularly to the first plane of symmetry, the rotation axis being located within the second plane of symmetry. This symmetrical embodiment of the four serpentine springs advantageously counteracts the occurrence of spurious modes.

The advantages described above are also ensured upon execution of a corresponding manufacturing method for such a micromechanical component, in accordance with an example embodiment of the present invention. It is expressly noted that the manufacturing method can be refined in such a way that all the micromechanical components explained above can be manufactured therewith.

BRIEF DESCRIPTION OF THE DRAWINGS

Further features and advantages of the present invention will be explained below with reference to the Figures.

DETAILED DESCRIPTION OF EXAMPLE EMBODIMENTS

Figure 1:
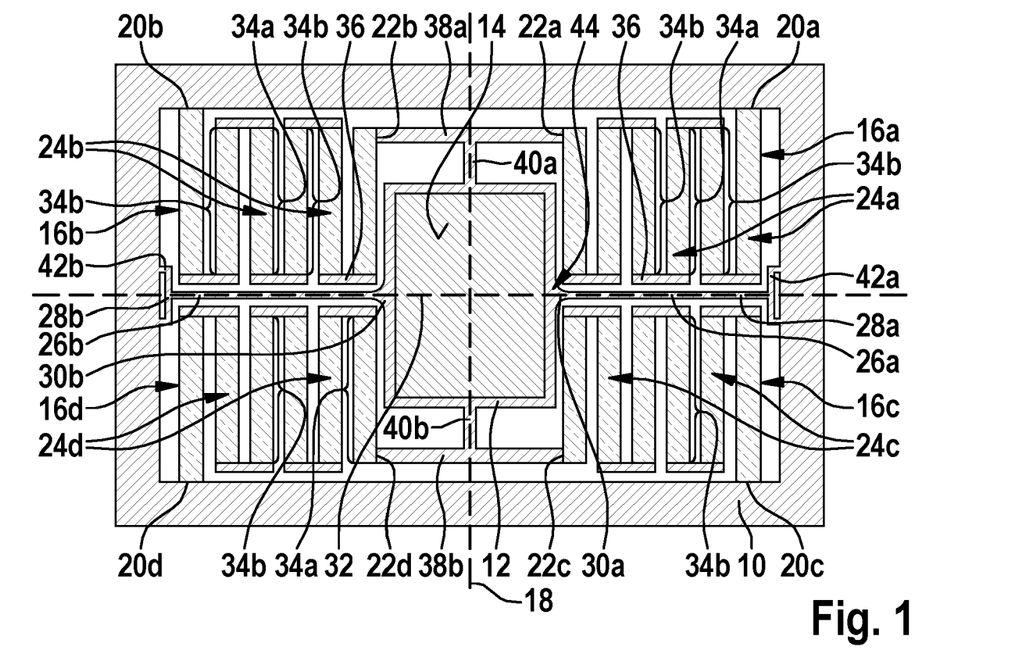
FIG. 1 is a schematic overall depiction of a first embodiment of the micromechanical component, in accordance with the present invention.

FIG. 1 is a schematic overall depiction of a first embodiment of the micromechanical component.

The micromechanical component schematically depicted in FIG. 1 encompasses a mount 10 and a part 12 that is displaceable with respect to mount 10. Displaceable part 12 is embodied, by way of example, as a micromirror 12 having a reflective surface 14. A range of embodiment of the micromechanical component is not, however, limited to equipping it with micromirror 12 as displaceable part 12. The frame shape of mount 10 is also to be interpreted only as exemplifying.

The micromechanical component of FIG. 1 has a first serpentine spring 16a and a second serpentine spring 16b embodied mirror-symmetrically with respect to first serpentine spring 16a in terms of a first plane of symmetry 18. As an optional refinement, the micromechanical component also encompasses a third serpentine spring 16c and a fourth serpentine spring 16d embodied mirror-symmetrically with respect to third serpentine spring 16c in terms of first plane of symmetry 18. Each of serpentine springs 16a to 16d is attached, at a respective outer end 20a to 20d of the respective serpentine spring 16a to 16d, directly or indirectly to mount 10. In addition, each of serpentine springs 16a to 16d is attached, at a respective inner end 22a to 22d of the respective serpentine spring 16a to 16d, directly or indirectly to displaceable part 12. Because of their serpentine shape, serpentine springs 16a to 16d can be embodied to be comparatively long without causing the individual lengths of serpentine springs 16a to 16d to contribute to a significant enlargement of the micromechanical component. An individual length of serpentine springs 16a to 16d can be, for example, greater than or equal to 8 mm (millimeters), in particular greater than or equal to 10 mm (millimeters), especially greater than or equal to 12 mm (millimeters).

In addition, a first actuator device 24a is embodied on and/or in first serpentine spring 16a, and a second actuator device 24b is embodied on and/or in second serpentine spring 16b, in such a way that by way of first actuator device 24a and second actuator device 24b, periodic deformations, mirror-symmetrical in terms of first plane of symmetry 18, of first serpentine spring 16a and of second serpentine spring 16b are excitable or become excited. Displaceable part 12 can thereby be displaced with respect to mount 10 at least by way of the deformations, mirror-symmetrical in terms of first plane of symmetry 18, of first serpentine spring 16a and of second serpentine spring 16b. As an optional refinement, the micromechanical component of FIG. 1 additionally has a third actuator device 24c on and/or in third serpentine spring 16c and a fourth actuator device 24d on and/or in fourth serpentine spring 16d, in such a way that by way of third actuator device 24c and fourth actuator device 24d, periodic deformations, mirror-symmetrical in terms of first plane of symmetry 18, of third serpentine spring 16c and of fourth serpentine spring 16d are excitable or become excited. It is desirable that the periodic deformations, mirror-symmetrical in terms of first plane of symmetry 18, of third serpentine spring 16c and of fourth serpentine spring 16d be opposite in phase to the periodic and mirror-symmetrical deformations of first serpentine spring 16a and of second serpentine spring 16b. As will be explained below in further detail, in this case the deformations of all four serpentine springs 16a to 16d can be used to transfer comparatively large displacement forces onto displaceable element 12.

The micromechanical component reproduced schematically in FIG. 1 also has a first torsion spring 26a and a second torsion spring 26b, which are each attached at an outer end 28a or 28b of the respective torsion spring 26a or 26b directly or indirectly to mount 10, and are attached each at an inner end 30a or 30b of the respective torsion spring 26a or 26b directly or indirectly to displaceable part 12. First torsion spring 26a and second torsion spring 26b extend respectively along a rotation axis 32. Displaceable part 12 is therefore displaceable, at least by way of the periodic and mirror-symmetrical deformations of first serpentine spring 16a and of second serpentine spring 16b (and, if applicable, by way of the deformations, opposite in phase thereto, of third serpentine spring 16c and of fourth serpentine spring 16d) around rotation axis 32 with respect to mount 10.

First torsion spring 26a and second torsion spring 26b bring about a "securing" of the desired rotation axis 32 with respect to undesired displacement motions of displaceable part 12. First torsion spring 26a and second torsion spring 26b thus contribute to stabilizing the desired rotational motion of displaceable part 12 around rotation axis 32. In particular, first torsion spring 26a and second torsion spring 26b increase a stiffness of the micromechanical component with respect to an undesired displacement motion of displaceable part 12 in a direction aligned perpendicularly to the plane of torsion springs 26a and 26b. An occurrence or a frequency of occurrence of further undesired displacement motions of the displaceable part, i.e. an occurrence or frequency of occurrence of the excitation of so-called spurious modes, is therefore reduced or prevented by way of first torsion spring 26a and second torsion spring 26b. This ensures more reliable operation of the micromechanical component.

If third serpentine spring 16c and fourth serpentine spring 16d are embodied on the micromechanical component, third serpentine spring 16c and fourth serpentine spring 16d are preferably mirror-symmetrical with respect to first serpentine spring 16a and to second serpentine spring 16b in terms of a second plane of symmetry aligned perpendicularly to first plane of symmetry 18, rotation axis 32 being located within the second plane of symmetry (not depicted). Maintaining such a symmetry in the micromechanical component also contributes advantageously to a reduction in spurious modes.

In the example of FIG. 1, actuator devices 24a to 24d each encompass several piezoelectric actuator layers 24a to 24d made of at least one piezoelectric material. Each serpentine spring 16a to 16d can have piezoelectric actuator layers 24a to 24d made of the same piezoelectric material or of different piezoelectric materials. The at least one piezoelectric material can be, for example, a PZT (lead zirconate titanate) bimetal. Piezoelectric actuator layers 24a to 24d can have, for instance, a thickness between 1 μm (micrometer) and 2 μm (micrometers).

The respective piezoelectric actuator layers 24a to 24d are embodied on and/or in several sub-portions 34a and 34b of the associated serpentine springs 16a to 16d. Preferably, each two adjacent sub-portions 34a and 34b, embodied with piezoelectric actuator layers 24a to 24d, of the respective serpentine springs 16a to 16d are connected to one another each via an intermediate portion 36 of the respective serpentine spring 16a to 16d, intermediate portions 36 being understood as spring portions devoid of at least one piezoelectric material. It is also advantageous if sub-portions 34a and 34b, embodied with piezoelectric actuator layers 24a to 24d, of serpentine springs 16a to 16d extend parallel to one another and perpendicularly to rotation axis 32.

For interaction with piezoelectric actuator layers 24a to 24d, actuator devices 24a to 24d also each have at least one electrical lead (not depicted) that is embodied on and/or in the associated serpentine spring 16a to 16d. At least one voltage signal can thereby be applied to piezoelectric actuator layers 24a to 24d in such a way that at least the periodic and mirror-symmetrical deformations of first serpentine spring 16a and of second serpentine spring 16b (and preferably also the deformations, opposite in phase thereto, of third serpentine spring 16c and of fourth serpentine spring 16d) are producible or become produced. Such an embodiment of actuator devices 24a to 24d as piezoelectric actuator devices 24a to 24d is notable for large displacement forces but only short actuating travels. A displacement of displaceable part 12 around rotation axis 32 by way of piezoelectric actuator devices 24a to 24 described here preferably does not occur resonantly.

When no voltage is being applied to piezoelectric actuator layers 24a to 24d, displaceable part 12 is in its so-called idle position with respect to mount 10. Application of the at least one voltage signal to piezoelectric actuator layers 24a to 24d can selectably cause a tensile stress or a flexural stress to be exerted on the respective sub-portion 34a and 34b. Preferably, several first sub-portions 34a and several second sub-portions 34b are respectively definable for each of serpentine springs 16a to 16d, a second sub-portion 34b of the respective serpentine spring 16a to 16d respectively being located between two first sub-portions 34a of the same serpentine spring 16a to 16d, and a first sub-portion 34a of the respective serpentine spring 16a to 16d being located between two second sub-portions 34b of the same serpentine spring 16a to 16d. In this case the at least one voltage signal is applied to piezoelectric actuator layers 24a to 24d in such a way that alternatingly either a tensile stress is exerted on all first sub-portions 34a of serpentine springs 16a to 16d and a flexural stress is exerted on all second sub-portions 34b of serpentine springs 16a to 16d, or a flexural stress is exerted on all first sub-portions of 34a of serpentine springs 16a to 16d and a tensile stress is exerted on all second sub-portions 34b of serpentine springs 16a to 16d. Upon a concave deflection of all first sub-portions 34a of serpentine springs 16a to 16d, second sub-portions 34b of serpentine springs 16a to 16d at the same time become deflected convexly, while upon a convex deflection of all first sub-portions 34a of serpentine springs 16a to 16d, second sub-portions 34b of serpentine springs 16a to 16d at the same time become deflected concavely. An alternating convex and concave deflection of serpentine springs 16a to 16d in this manner brings about a comparatively strong displacement of displaceable part 12 out of its idle position through a relatively large displacement angle around rotation axis 32 with respect to mount 10. The displacement angle of displaceable part 12 around rotation axis 32 brought about by way of the alternating convex and concave deflection of serpentine springs 16a to 16d can be, for example, greater than or equal to 4° (degrees).

In the example of FIG. 1, inner ends 22a and 22b of first serpentine spring 16a and of second serpentine spring 16b are also attached to a first fastening strut 38a that is located on a first side of rotation axis 32 and proceeds parallel to rotation axis 32. Correspondingly, inner ends 22c and 22d of third serpentine spring 16c and of fourth serpentine spring 16d are attached to a second fastening strut 38b that proceeds parallel to rotation axis 32 and is located on a second side of rotation axis 32. Displaceable part 12 is attached to fastening struts 38a via respective connecting elements 40a and 40b extending perpendicularly to rotation axis 32. The periodic and mirror-symmetrical deformations of first serpentine spring 16a and of second serpentine spring 16b (and, if applicable, the deformations, opposite in phase thereto, of third serpentine spring 16c and of fourth serpentine spring 16d) bring about opposite-phase motions of fastening struts 38a and 38b perpendicularly to rotation axis 32, and thus a "seesawing" of adjustable part 12 around rotation axis 32.

As is shown in FIG. 1, first torsion spring 26a and second torsion spring 26b can also be "integrated" with a further type of spring. For example, outer ends 28a and 28b of torsion springs 26a and 26b are each also attached to a U-spring 42a and 42b, the respective U-springs 42a and 42b being "fork-mounted" with respect to mount 10. This type of integration of torsion springs 26*a* and 26*b* with a further type of spring can improve a displaceability of displaceable part 12 around rotation axis 32 with respect to mount 10, while torsion springs 26*a* and 26*b* nevertheless advantageously counteract undesired spurious modes.

As an advantageous refinement, the micromechanical component can also encompass at least one sensor device 44 that is designed to output or furnish at least one sensor signal corresponding to an excursion of displaceable part 12 out of its idle position with respect to mount 10. Sensor device 44 can be, for example, a piezoelectric or piezoresistive sensor device 44. Sensor device 44 is preferably embodied on and/or in an "anchoring region" of first torsion spring 26*a* on displaceable part 12 and/or on and/or in an "anchoring region" of second torsion spring 26*b* on displaceable part 12. The embodiment of sensor device 44 on and/or in the "anchoring region" of first torsion spring 26*a* on displaceable part 12 and/or on and/or in the "anchoring region" of second torsion spring 26*b* on displaceable part 12 makes possible unequivocal detection or recognition of an excursion of displaceable part 12 out of its idle position around rotation axis 32 with respect to mount 10. In particular, such an embodiment of sensor device 44 is more advantageous than the conventional positioning of a sensor system on one of serpentine springs 16*a* to 16*d*, which often does not allow a reliable correlation with the excursion of displaceable part 12 and furthermore leads to the disadvantage that spurious modes of the micromechanical component can be incorrectly interpreted as the desired excursion of displaceable part 12 out of its idle position around rotation axis 32.

Advantageously, sensor device 44 is furthermore connected, via at least one signal lead (not depicted) embodied on and/or in first and/or second torsion spring 26*a* or 26*b*, to an evaluation electronic system embodied on mount 10 or to an evaluation electronic system attachment contact embodied on mount 10. Torsion springs 26*a* and 26*b* offer additional attachments of displaceable part 12 onto mount 10 which can be used to attach the at least one signal lead of sensor device 44. It is therefore easily possible to dispense with configuration of the at least one signal lead on and/or in the at least two serpentine springs 16*a* to 16*d*. A flexural stiffness of the at least two serpentine springs 16*a* to 16*d* is thus not impaired by the at least one signal lead carried via at least one of torsion springs 26*a* and 26*b*. The signal lead is furthermore not influenced by the convex or concave deflection of serpentine springs 16*a* to 16*d*, and the electrical signals of the actuator lead and signal lead are not disrupted.

Figure 2:
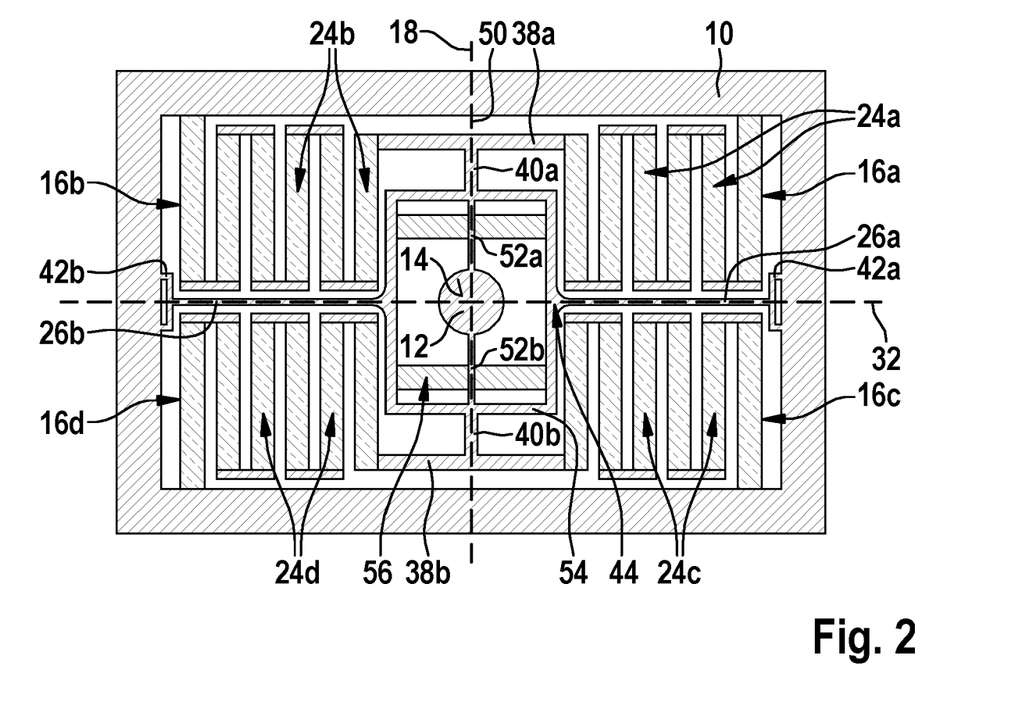
FIG. 2 is a schematic overall depiction of a second embodiment of the micromechanical component, in accordance with the present invention.

FIG. 2 is a schematic overall depiction of a second embodiment of the micromechanical component.

The micromechanical component schematically depicted in FIG. 2 is a refinement of the above-described embodiment. In particular, displaceable part 12 of the micromechanical component of FIG. 2 is also displaceable around a further rotation axis 50 aligned tiltedly or perpendicularly with respect to rotation axis 32. Further rotation axis 50 is preferably located in first plane of symmetry 18 (not shown in FIG. 2).

Displaceable part 12 is suspended in an internal frame 54 via two intermediate springs 52*a* and 52*b* extending along further rotation axis 50, internal frame 54 being fastened between connecting parts 40*a* and 40*b*. At least one further actuator device 56 can be embodied on displaceable part 12 and/or on internal frame 54 for displacement of the displaceable part 12 around further rotation axis 50. The at least one further actuator device 56 is, however, reproduced only schematically in FIG. 2. Be it noted, however, that the at least one further actuator device 56 is embodied to displace displaceable part 12 around further rotation axis 50 "separately" from the four actuator devices 24*a* to 24*d* for displacing displaceable part 12 around rotation axis 32. Thanks to the "separate" embodiment of the four actuator devices 24*a* to 24*d* from the at least one further actuator device 56, the four actuator devices 24*a* to 24*d* can be operated, independently of the at least one further actuator device 56, in such a way that the different displacement motions or rotational modes of displaceable part 12 have less influence on one another. Whereas the displacement of displaceable part 12 around rotation axis 32 by way of the four actuator devices 24*a* to 24*d* preferably does not occur resonantly, for the displacement of displaceable part 12 around further rotation axis 50 a resonant oscillation of displaceable part 12 around further rotation axis 50 can be excitable by way of the at least one further actuator device 56.

Regarding further features of the micromechanical component of FIG. 2, reference is made to the embodiments described above.

Figure 3A:
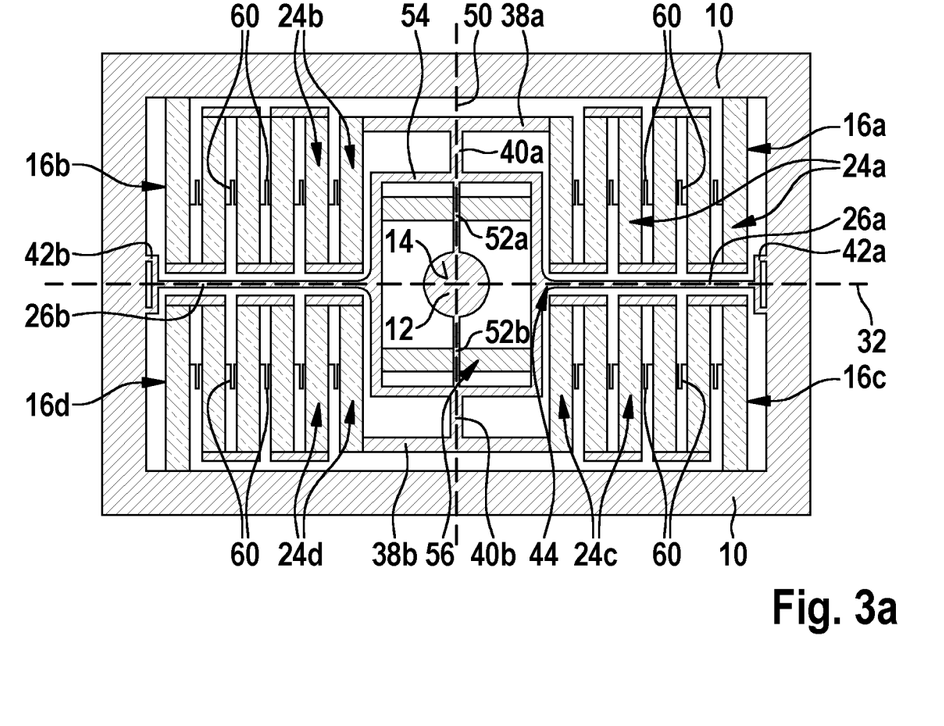
FIGS. 3a and 3b are overall and partial depictions of a third embodiment of the micromechanical component, in accordance with the present invention.
Figure 3B:
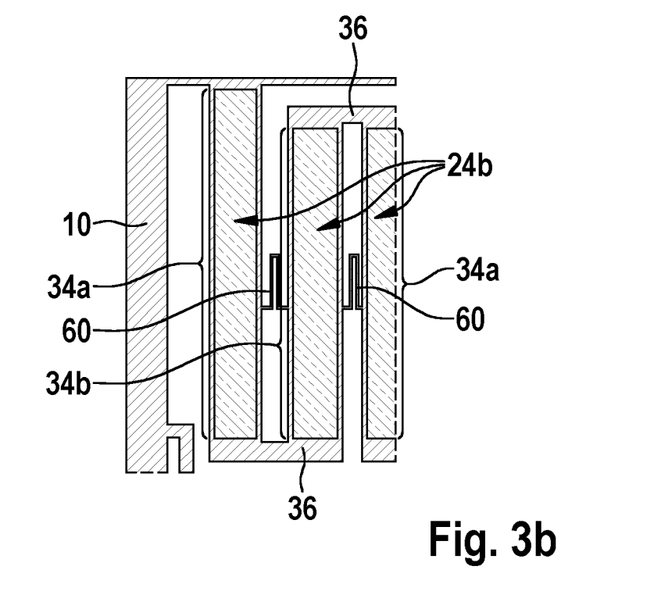

FIGS. 3*a* and 3*b* are overall and partial depictions of a third embodiment of the micromechanical component.

The micromechanical component schematically depicted on FIGS. 3*a* and 3*b* is a refinement of the embodiment described above. As a supplement to the features explained above, two sub-portions 34*a* and 34*b* of serpentine springs 16*a* to 16*d* which are respectively embodied adjacently to piezoelectric actuator layers 24*a* to 24*d*, for instance a respective first sub-portion 34*a* and a respective sub-portion 34*b* of the same serpentine spring 16*a* to 16*d*, are connected to one another via a respective intermediate spring element 60. Intermediate spring elements 60 can be, for example, U-springs 60. Intermediate spring elements 60 are preferably embodied at a center of the two sub-portions 34*a* and 34*b*, embodied adjacently to piezoelectric actuator layers 24*a* to 24*d* and extending perpendicularly to rotation axis 32, of the same serpentine spring 16*a* to 16*d*, since in such a case there is almost no excursion of the anchoring regions of the respective intermediate spring element 60 when a tensile stress is exerted on one of the two sub-portions 34*a* or 34*b* and a flexural stress is simultaneously exerted on the other of the two sub-portions 34*a* or 34*b*.

Regarding further features of the micromechanical component of FIGS. 3*a* and 3*b*, reference is made to the embodiments described above.

Figure 4:
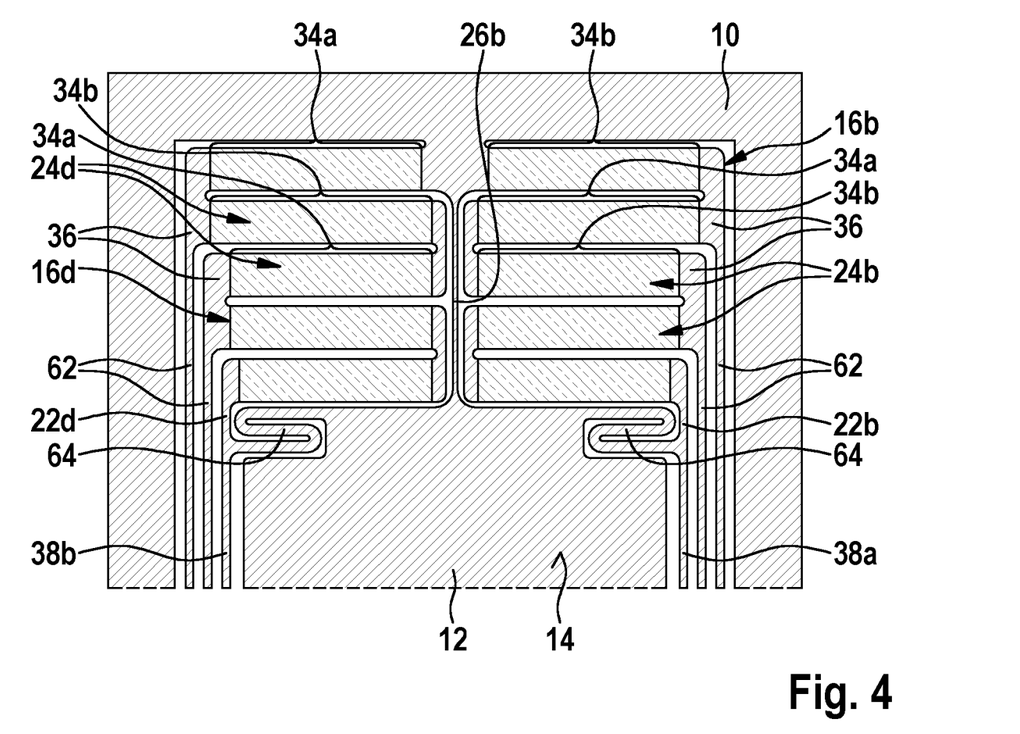
FIG. 4 is a schematic partial depiction of a fourth embodiment of the micromechanical component, in accordance with the present invention.

FIG. 4 is a schematic partial depiction of a fourth embodiment of the micromechanical component.

In the micromechanical component of FIG. 4, at least one of intermediate portions 36 of first serpentine spring 16*a* (and correspondingly at least one of intermediate portions 36 of third serpentine spring 16*c*) is connected via a respective strut element 62 to intermediate portion 36, mirror-symmetrical with respect thereto in terms of first plane of symmetry 18, of second serpentine spring 16*b* (or to intermediate portion 36, mirror-symmetrical with respect thereto in terms of first plane of symmetry 18, of second serpentine spring 16*d*). Strut elements 62 preferably extend parallel to rotation axis 32. Strut elements 62 contribute to the desired retention of the symmetry of the deformations of springs 16*a* to 16*d*, and thus additionally reduce a frequency of occurrence, or an intensity, of the excitation of spurious modes. In particular, each of intermediate portions 36, located with respect to sub-portions 34*a* and 34*b* of first serpentine spring 16*a* on the side facing away from rotation axis 32, of first serpentine spring 16*a* (and correspondingly each of intermediate portions 36, located with respect to sub-portions 34*a* and 34*b* of first serpentine spring 16*a* on the side facing away from rotation axis 32, of third serpentine spring 16c) can be connected via a respective strut element 62 to intermediate portion 36, mirror-symmetrical with respect thereto in terms of first plane of symmetry 18, of second serpentine spring 16b (or to intermediate portion 36, mirror-symmetrical with respect thereto in terms of first plane of symmetry 18, of second serpentine spring 16d).

As depicted in FIG. 4, inner ends 22a to 22d of serpentine springs 16a and 16b can also be attached, in addition to the associated fastening strut 38a or 38b, to displaceable part 12 or to internal frame 54 via a respective resilient suspension system 64. Resilient suspension systems 64 implement "stress-relief units" by way of which tensile stresses occurring during the deformations of serpentine springs 16a to 16d can be compensated for. The respective resilient suspension system 64 can be embodied, for example, in the form of a serpentine spring 64 that is attached at a first end to inner end 22a to 22d of the associated serpentine spring 16 and 16b, and at a second end to displacement part 12 or to internal frame 54.

Regarding further features of the micromechanical component of FIG. 4, reference is made to the embodiment of FIG. 1 described above.

FIGS. 5a to 5d are overall and partial depictions of a fifth embodiment of the micromechanical component.

The micromechanical component schematically depicted in FIGS. 5a to 5d has only first serpentine spring 16a and second serpentine spring 16b, embodied mirror-symmetrically with respect to first serpentine spring 16a in terms of first plane of symmetry 18. Further serpentine springs are omitted in the micromechanical component of FIGS. 5a to 5d. Because of the additional (direct or indirect) attachment of displaceable part 12 via first torsion spring 26a and second torsion spring 26b which extend respectively along rotation axis 32, however, the desired displacement motion of displaceable part 12 around rotation axis 32 can be executed reliably even when further serpentine springs are omitted, a frequency of occurrence of spurious modes being considerably reduced as compared with the related art.

Advantageously, outer end 28a of first torsion spring 26a is fastened to a first fastening strut 70a, and outer end 28b of second torsion spring 26b is fastened to a second fastening strut 70b; fastening struts 70a and 70b proceed perpendicularly to rotation axis 32, and first fastening strut 70a is disposed between first serpentine spring 16a and displaceable part 12 or an internal frame 72 surrounding displaceable part 12, and second fastening strut 70b is disposed between second serpentine spring 16b and displaceable part 12 or internal frame 72. As is evident from FIG. 5a, attachment of torsion springs 26a and 26b to such fastening struts 70a and 70b makes possible a relatively large elongation of serpentine springs 16a and 16b perpendicularly to rotation axis 32.

Figure 5A:
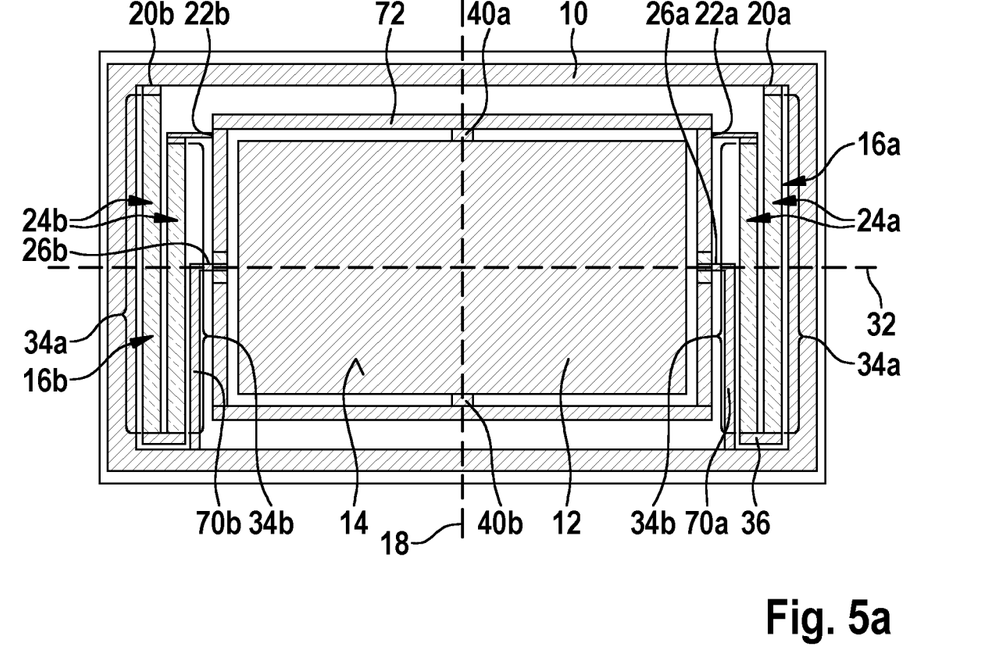
FIGS. 5a to 5d are overall and partial depictions of a fifth embodiment of the micromechanical component, in accordance with the present invention.
Figure 5B:
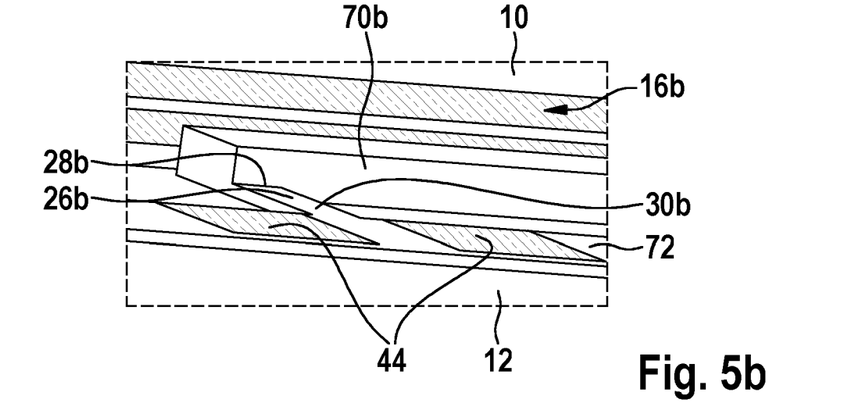

As is evident from FIG. 5b, fastening struts 70a and 70b can have a greater height and a greater width than torsion springs 26a and 26b. Undesired "lifting" of displaceable part 12 out of a plane of the two torsion springs 26a and 26b, or a spurious mode of displaceable part 12 perpendicularly to rotation axis 32, can be reliably suppressed by way of such an embodiment of fastening struts 70a and 70b.

With the micromechanical component of FIGS. 5a to 5d as well, rotation axis 32 is definable not (exclusively) via the configuration of serpentine springs 16 and 16b, but via the configuration of torsion springs 26a and 26b. The location of rotation axis 32 can be varied by varying the positions of torsion springs 26a and 26b. In addition, natural frequencies of the desired displacement motion of displaceable part 12 around rotation axis 32 can be defined by way of the configuration of torsion springs 26a and 26b. Torques produced on displaceable part 12, or on the surrounding internal frame 72, can be varied by varying the engagement points of inner ends 22a and 22b on serpentine springs 16 and 16b.

Figure 5C:
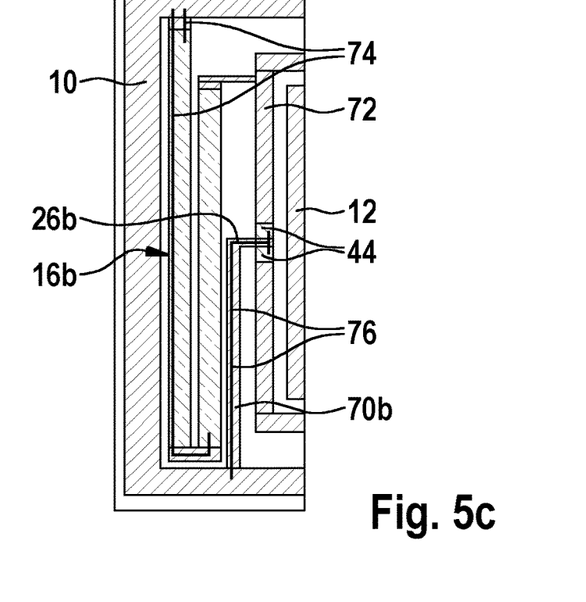
Figure 5D:
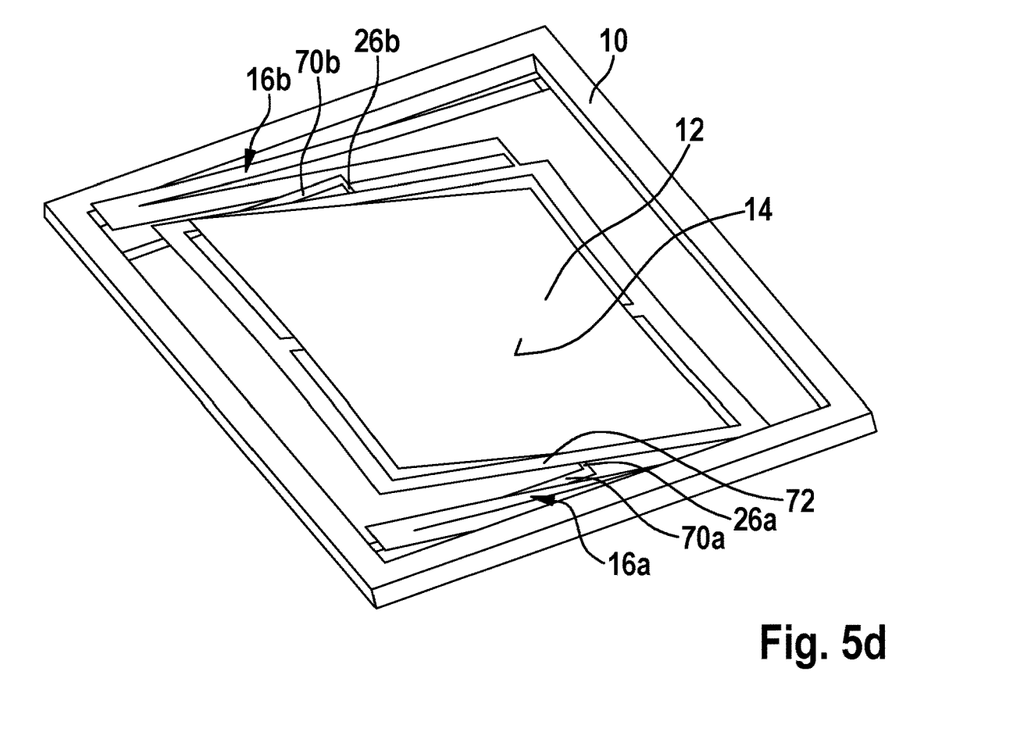

FIG. 5c shows the at least one electrical lead 74 for applying the at least one voltage signal to piezoelectric actuator layers 24a and 24b of first serpentine spring 16a and of second serpentine spring 16b, and the at least one signal lead 76 embodied on and/or in first torsion spring 26a and/or second torsion spring 26b for connection to the at least one sensor device 44 that is embodied on and/or in displaceable part 12 or the surrounding internal frame 72. The micromechanical component of FIGS. 5a to 5d thus also exhibits a separation of actuation and detection elements, thereby preventing crosstalk between signals carried by leads 74 and 76.

Regarding further features of the micromechanical component of FIGS. 5a to 5d, reference is made to the embodiments described above.

Figure 6:
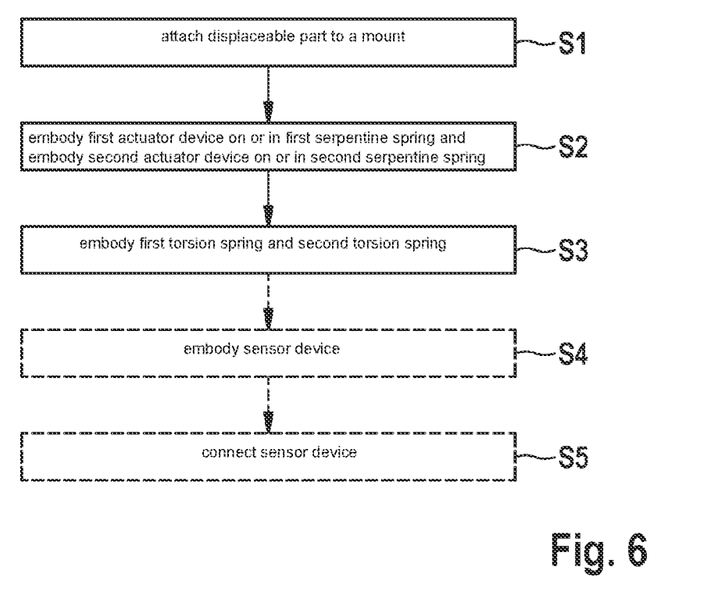
FIG. 6 is a flow chart to explain an example embodiment of the manufacturing method, in accordance with the present invention.

FIG. 6 is a flow chart to explain an embodiment of the manufacturing method.

All the above-described micromechanical components can be manufactured by way of a manufacturing method described below. A range of implementation of the manufacturing method is not limited, however, to manufacturing of the above-described micromechanical components.

In a method step S1, a displaceable part is attached to a mount via at least a first serpentine spring and a second serpentine spring embodied mirror-symmetrically with respect to the first serpentine spring in terms of a first plane of symmetry, a respective outer end of the respective serpentine spring being attached directly or indirectly to the mount, and a respective inner end of the respective serpentine spring being attached directly or indirectly to the displaceable part. In addition, in a method step S2 at least a first actuator device is embodied on and/or in the first serpentine spring, and a second actuator device is embodied on and/or in the second serpentine spring, in such a way that upon operation of the subsequent micromechanical component, periodic deformations, mirror-symmetrical in terms of the first plane of symmetry, of the first serpentine spring and of the second serpentine spring are excited by way of the first actuator device and the second actuator device, the displaceable part being displaced with respect to the mount.

The manufacturing method also encompasses a method step S3 in which a first torsion spring and second torsion spring which each extend along a rotation axis are embodied, a respective outer end of the respective torsion spring being thereby attached directly or indirectly to the mount and a respective inner end of the respective torsion spring being thus attached directly or indirectly to the displaceable part. The result of this is that the displaceable part is displaced around the rotation axis with respect to the mount at least by way of the periodic and mirror-symmetrical deformations of the first serpentine spring and of the second serpentine spring. The manufacturing method described here thus also brings about the advantages explained earlier. In order to execute method steps S1 and S3, the respective components can be patterned, for example, out of monocrystalline, polycrystalline, or epi-polycrystalline silicon, especially out of a silicon layer of a silicon-on-insulator (SOI) substrate.

As an optional refinement, the manufacturing method can also encompass method steps S4 and S5. In method step S4, a sensor device for furnishing or outputting at least one sensor signal, corresponding to an excursion of the displaceable part out of its idle position with respect to the mount, is embodied. In method step S5, the sensor device is connected, via at least one signal lead embodied on and/or in the first torsion spring and/or the second torsion spring, to an evaluation electronic system embodied on the mount or to an evaluation electronic system attachment contact embodied on the mount. Further components of the above-described micromechanical component can also be embodied by way of corresponding method steps. The micromechanical components described above can be implemented technologically in simple fashion.

Method steps S1 to S5 can be executed in any sequence, overlappingly in time, or simultaneously.

What is claimed is:

1. A micromechanical component, comprising:
   a mount;
   a displaceable part;
   a first serpentine spring and a second serpentine spring which is embodied mirror-symmetrically with respect to the first serpentine spring in terms of a first plane of symmetry, each respective serpentine spring of the first serpentine spring and the second serpentine spring being attached, at a respective outer end of the respective serpentine spring, directly or indirectly to the mount, and being attached at a respective inner end of the respective serpentine spring, directly or indirectly to the displaceable part;
   a first actuator device embodied on and/or in the first serpentine spring, and a second actuator device being embodied on and/or in the second serpentine spring, so that by the first actuator device and the second actuator device, periodic deformations, mirror-symmetrical in terms of the first plane of symmetry, of the first serpentine spring and of the second serpentine spring are excitable, with a result that the displaceable part is displaceable with respect to the mount; and
   a first torsion spring and a second torsion spring, which each extend along a rotation axis, each respective torsion spring of the first torsion spring and the second torsion spring being attached at an outer end of the respective torsion spring, directly or indirectly to the mount, and being attached at an inner end of the respective torsion spring directly or indirectly to the displaceable part;
   wherein the displaceable part is displaceable, at least by the periodic and mirror-symmetrical deformations of the first serpentine spring and of the second serpentine spring, around the rotation axis with respect to the mount, and
   wherein inner ends of the first serpentine spring and of the second serpentine spring are attached to a first fastening strut that is on a first side of the rotation axis and proceeds parallel to the rotation axis, and wherein the displaceable part is attached to the first fastening strut.

2. The micromechanical component as recited in claim 1, further comprising:
   at least one sensor device configured to output or furnish at least one sensor signal corresponding to an excursion of the displaceable part out of an idle position with respect to the mount, the sensor device being connected, via at least one signal lead embodied on and/or in the first torsion spring and/or the second torsion spring, to an evaluating electronic system embodied on the mount or to an evaluating electronic system application contact embodied on the mount.

3. The micromechanical component as recited in claim 1, wherein the first actuator device and the second actuator device each encompass several piezoelectric actuator layers made of at least one piezoelectric material, the piezoelectric actuator layers of the first actuator device being embodied on and/or in several sub-portions of the first serpentine spring, and the piezoelectric actuator layers of the second actuator device being embodied on and/or in several sub-portions of the second serpentine spring, the first actuator device encompasses at least one electrical lead that is embodied on and/or in the first serpentine spring, and the second actuator device encompasses at least one electrical lead that is embodiment on and/or in the second serpentine spring, so that at least one voltage signal can be applied to the piezoelectric actuator layers of the first serpentine spring and of the second serpentine spring so that the periodic and mirror-symmetrical deformations of the first serpentine spring and of the second serpentine spring are producible.

4. The micromechanical component as recited in claim 3, wherein the sub-portions of the first serpentine spring which are embodied with piezoelectric actuator layers, and the sub-portions of the second serpentine spring which are embodied with piezoelectric actuator layers, are aligned parallel to one another and perpendicularly to the rotation axis.

5. The micromechanical component as recited in claim 4, wherein at least two adjacent sub-portions of the first serpentine spring which are embodied with piezoelectric actuator layers, and at least two adjacent sub-portions of the second serpentine spring which are embodied with piezoelectric actuator layers, are connected to one another via a respective intermediate spring element.

6. The micromechanical component as recited in claim 1, wherein inner ends of a third serpentine spring and of a fourth serpentine spring are attached to a second fastening strut that proceeds parallel to the rotation axis and is located on a second side of the rotation axis.

7. The micromechanical component as recited in claim 6, wherein the displaceable part is also attached to the second fastening strut.

8. The micromechanical component as recited in claim 7, wherein periodic and mirror-symmetrical deformations of the first serpentine spring and of the second serpentine spring cause opposite-phase motions of the first fastening strut and of the second fastening strut perpendicularly to the rotation axis.

9. A micromechanical component, comprising:
   a mount;
   a displaceable part;
   a first serpentine spring and a second serpentine spring which is embodied mirror-symmetrically with respect to the first serpentine spring in terms of a first plane of symmetry, each respective serpentine spring of the first serpentine spring and the second serpentine spring being attached, at a respective outer end of the respective serpentine spring, directly or indirectly to the mount, and being attached at a respective inner end of the respective serpentine spring, directly or indirectly to the displaceable part;
   a first actuator device embodied on and/or in the first serpentine spring, and a second actuator device being embodied on and/or in the second serpentine spring, so that by the first actuator device and the second actuator device, periodic deformations, mirror-symmetrical in terms of the first plane of symmetry, of the first serpentine spring and of the second serpentine spring are excitable, with a result that the displaceable part is displaceable with respect to the mount; and
   a first torsion spring and a second torsion spring, which each extend along a rotation axis, each respective torsion spring of the first torsion spring and the second torsion spring being attached at an outer end of the respective torsion spring, directly or indirectly to the mount, and being attached at an inner end of the respective torsion spring directly or indirectly to the displaceable part;

wherein the displaceable part is displaceable, at least by the periodic and mirror-symmetrical deformations of the first serpentine spring and of the second serpentine spring, around the rotation axis with respect to the mount, wherein the first actuator device and the second actuator device each encompass several piezoelectric actuator layers made of at least one piezoelectric material, the piezoelectric actuator layers of the first actuator device being embodied on and/or in several sub-portions of the first serpentine spring, and the piezoelectric actuator layers of the second actuator device being embodied on and/or in several sub-portions of the second serpentine spring, the first actuator device encompasses at least one electrical lead that is embodied on and/or in the first serpentine spring, and the second actuator device encompasses at least one electrical lead that is embodiment on and/or in the second serpentine spring, so that at least one voltage signal can be applied to the piezoelectric actuator layers of the first serpentine spring and of the second serpentine spring so that the periodic and mirror-symmetrical deformations of the first serpentine spring and of the second serpentine spring are producible, and wherein each two adjacent sub-portions, embodied with the piezoelectric actuator layers, of the first serpentine spring are connected to one another via a respective intermediate portion of the first serpentine spring, and each two adjacent sub-portions, embodied with piezoelectric actuator layers, of the second serpentine spring are connected to one another via a respective intermediate portion of the second serpentine spring, and wherein at least one of the intermediate portions of the first serpentine spring is connected via a respective strut element to that intermediate portion of the second serpentine spring which is mirror-symmetrical in terms of the first plane of symmetry.

10. A micromechanical component, comprising:
a mount;
a displaceable part;
a first serpentine spring and a second serpentine spring which is embodied mirror-symmetrically with respect to the first serpentine spring in terms of a first plane of symmetry, each respective serpentine spring of the first serpentine spring and the second serpentine spring being attached, at a respective outer end of the respective serpentine spring, directly or indirectly to the mount, and being attached at a respective inner end of the respective serpentine spring, directly or indirectly to the displaceable part;
a first actuator device embodied on and/or in the first serpentine spring, and a second actuator device being embodied on and/or in the second serpentine spring, so that by the first actuator device and the second actuator device, periodic deformations, mirror-symmetrical in terms of the first plane of symmetry, of the first serpentine spring and of the second serpentine spring are excitable, with a result that the displaceable part is displaceable with respect to the mount; and
a first torsion spring and a second torsion spring, which each extend along a rotation axis, each respective torsion spring of the first torsion spring and the second torsion spring being attached at an outer end of the respective torsion spring, directly or indirectly to the mount, and being attached at an inner end of the respective torsion spring directly or indirectly to the displaceable part, wherein the displaceable part is displaceable, at least by the periodic and mirror-symmetrical deformations of the first serpentine spring and of the second serpentine spring, around the rotation axis with respect to the mount;
a third serpentine spring and a fourth serpentine spring which is embodied mirror-symmetrically with respect to the third serpentine spring in terms of the first plane of symmetry, each respective serpentine spring of the third serpentine spring and the fourth serpentine spring being attached at an outer end of the respective serpentine spring directly or indirectly to the mount, and each respective serpentine spring of the third serpentine spring and the fourth serpentine spring being attached at an inner end of the respective serpentine spring directly or indirectly to the displaceable part; and
a third actuator device embodied on and/or in the third serpentine spring, and a fourth actuator device being embodied on and/or in the fourth serpentine spring, so that by the third actuator device and the fourth actuator device, periodic deformations of the third serpentine spring and of the fourth serpentine spring which are mirror-symmetrical in terms of the first plane of symmetry are excitable by the third actuator device and the fourth actuator device, which deformations are opposite in phase to the periodic and mirror-symmetrical deformations of the first serpentine spring and of the second serpentine spring.

11. The micromechanical component as recited in claim 10, wherein the third serpentine spring and the fourth serpentine spring are mirror-symmetrical with respect to the first serpentine spring and the second serpentine spring in terms of a second plane of symmetry aligned perpendicularly to the first plane of symmetry, and the rotation axis being located within the second plane of symmetry.

12. A manufacturing method for a micromechanical component, the method comprising:
attaching a displaceable part to a mount using at least a first serpentine spring and a second serpentine spring which is embodied mirror-symmetrically with respect to the first serpentine spring in terms of a first plane of symmetry, a respective outer end of each respective serpentine spring of the first serpentine spring and the second serpentine spring being attached directly or indirectly to the mount, and a respective inner end of the respective serpentine spring being attached directly or indirectly to the displaceable part;
embodying a first actuator device on and/or in the first serpentine spring, and embodying a second actuator device on and/or in the second serpentine spring, so that upon operation of the micromechanical component, periodic deformations, mirror-symmetrical in terms of the first plane of symmetry, of the first serpentine spring and of the second serpentine spring are excited by the first actuator device and the second actuator device, the displaceable part being displaced with respect to the mount; and
embodying a first torsion spring and a second torsion spring which each extend along a rotation axis, a respective outer end of each respective torsion spring of the first torsion spring and the second torsion spring being attached directly or indirectly to the mount, and a respective inner end of the respective torsion spring being attached directly or indirectly to the displaceable part, so that the displaceable part is displaced, at least by the periodic and mirror-symmetrical deformations of the first serpentine spring and of the second serpentine spring, around the rotation axis with respect to the mount;

wherein inner ends of the first serpentine spring and of the second serpentine spring are attached to a first fastening strut that is on a first side of the rotation axis and proceeds parallel to the rotation axis, and wherein the displaceable part is attached to the first fastening strut.

13. The manufacturing method as recited in claim 12, further comprising:

embodying a sensor device to furnish or output at least one sensor signal corresponding to an excursion of the displaceable part out of an idle position with respect to the mount; and connecting the sensor device, via at least one signal lead embodied on and/or in the first torsion spring and/or the second torsion spring, to an evaluating electronic system embodied on the mount or to an evaluating electronic system application contact embodied on the mount.

* * * * *